(12) United States Patent
Leung et al.

(10) Patent No.: US 11,658,764 B2
(45) Date of Patent: May 23, 2023

(54) BIASING TECHNIQUE FOR RECEIVER BASED ON RADIO FREQUENCY (RF) JAMMER DETECTION

(71) Applicant: QUALCOMM Incorporated, San Diego, CA (US)

(72) Inventors: Lai Kan Leung, San Marcos, CA (US); Aleksandar Miodrag Tasic, San Diego, CA (US); Francesco Gatta, San Diego, CA (US); Chiewcharn Narathong, Laguna Niguel, CA (US); Kyle David Holland, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 23 days.

(21) Appl. No.: 17/124,368

(22) Filed: Dec. 16, 2020

(65) Prior Publication Data

US 2022/0190950 A1 Jun. 16, 2022

(51) Int. Cl.
*H04K 3/00* (2006.01)
*H03F 3/19* (2006.01)
*H03M 1/12* (2006.01)

(52) U.S. Cl.
CPC .......... *H04K 3/22* (2013.01); *H03F 3/19* (2013.01); *H03M 1/12* (2013.01); *H03F 2200/294* (2013.01); *H03F 2200/451* (2013.01)

(58) Field of Classification Search
CPC ....... H04K 3/22; H03F 3/19; H03F 2200/294; H03F 2200/451; H03M 1/12; H04B 1/1027; H04B 1/109
See application file for complete search history.

(56) References Cited

U.S. PATENT DOCUMENTS

| 6,175,279 | B1* | 1/2001 | Ciccarelli | H04B 1/109 330/296 |
| 6,668,028 | B1* | 12/2003 | Wieck | H04B 1/109 375/345 |
| 7,660,569 | B2* | 2/2010 | Xiong | H04W 52/0238 455/296 |
| 2003/0064692 | A1 | 4/2003 | Shi | |

(Continued)

OTHER PUBLICATIONS

International Search Report and Written Opinion—PCT/US2021/060374—ISA/EPO—dated Jun. 14, 2022.

*Primary Examiner* — Nguyen T Vo
(74) *Attorney, Agent, or Firm* — Loza & Loza LLP (57) ABSTRACT

The disclosure relates to an apparatus including a receiver configured to process a radio frequency (RF) signal to generate a baseband signal; a radio frequency (RF) jammer detector configured to generate a signal indicative of whether an RF jammer is present at an input of the receiver; and a receiver bias circuit configured to generate a supply voltage for the receiver based on the RF jammer indication signal. In another aspect, the apparatus includes constant gain bias circuit to maintain the gain of the receiver constant in response to changes in the supply voltage. In other aspects, the receiver bias circuit may suspend the generating of the supply voltage based on the RF jammer indication signal if the power level of the target received signal is above a threshold. In other aspects, the receiver bias circuit changes the supply voltage during cyclic prefix (CP) intervals between downlink intervals.

22 Claims, 5 Drawing Sheets

(56) References Cited

U.S. PATENT DOCUMENTS

| | | |
|---|---|---|
| 2003/0124999 A1 | 7/2003 | Parssinen et al. |
| 2004/0142670 A1* | 7/2004 | Ciccarelli ............... H04K 3/224 |
| | | 455/214 |
| 2005/0221790 A1 | 10/2005 | Persico et al. |
| 2010/0026547 A1 | 2/2010 | Weissman et al. |
| 2013/0102267 A1* | 4/2013 | Haub ................... H04B 1/1036 |
| | | 455/296 |
| 2016/0099686 A1* | 4/2016 | Perreault ............. H04B 1/0483 |
| | | 330/296 |
| 2016/0142085 A1* | 5/2016 | Choksi ................. H04B 1/1638 |
| | | 375/340 |
| 2017/0303274 A1* | 10/2017 | He ........................ H04L 5/0073 |
| 2017/0346514 A1* | 11/2017 | Dimpflmaier ........ H04B 1/1027 |
| 2018/0175806 A1* | 6/2018 | Mehrjoo ................ H03F 1/223 |
| 2019/0215111 A1* | 7/2019 | Wei ....................... H04L 5/0007 |
| 2021/0136699 A1* | 5/2021 | Scholand ............ H04W 52/242 |

* cited by examiner

BIASING TECHNIQUE FOR RECEIVER BASED ON RADIO FREQUENCY (RF) JAMMER DETECTION

FIELD

Aspects of the present disclosure relate generally to wireless receivers, and in particular, to biasing of a wireless receiver based on detection of a radio frequency (RF) jammer.

BACKGROUND

A wireless communication device includes a receiver configured to receive and process a downlink (DL) signal transmitted by a base station. Often, in addition to the receiver receiving the DL signal from the base station, the receiver receives unwanted signals, often referred to as radio frequency (RF) jammers or blockers. These unwanted signals typically impact the signal-to-noise (SNR) and block error rate (BER or BLER) associated with the DL signal. A receiver should be able to deal with RF jammers or blockers to reduce or minimize degradation in the SNR and BER, while also reducing or minimizing power consumption.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes a receiver; a radio frequency (RF) jammer detector including an input coupled to the receiver; and a receiver bias circuit including an input coupled to an output of the RF jammer detector, and a supply voltage output, configured to produce an adjustable supply voltage, coupled to a supply voltage input of the receiver.

Another aspect of the disclosure relates to an apparatus. The apparatus includes a receiver configured to process a radio frequency (RF) signal to generate a baseband signal; a radio frequency (RF) jammer detector configured to process the RF signal to generate a signal indicative of whether an RF jammer is present at an input of the receiver; and a receiver bias circuit configured to generate a supply voltage for the receiver based on the RF jammer indication signal.

Another aspect of the disclosure relates to a method. The method includes processing a radio frequency (RF) signal received at an input to generate a baseband signal; generating a signal indicative of whether an RF jammer is present at the input; and generating a supply voltage based on the RF jammer indication signal, wherein processing the RF signal to generate the baseband signal is based on the supply voltage.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Designing a receiver for a wireless communication device usually involves multiple considerations, such as power consumption to improve a continuous use life of a battery powering the wireless communication device, and a data throughput of the wireless communication device. However, in many cases, the power consumption is in conflict with the battery life. For example, reducing the power consumption of a receiver may lead to the reducing the data throughput of the receiver, while increasing the data throughput of the receiver may lead to increasing the power consumption of the receiver.

An example of such conflict or tradeoff deals has to do when a jammer is applied to an input of a receiver. A jammer is an unwanted radio frequency (RF) received signal that lies proximate the in-band of a desired or target RF received signal (e.g., a downlink (DL) signal transmitted by a base station for the associated wireless communication device). When there is no jammer, a receiver may be configured to process the target RF received signal to generate a baseband signal, which may be digitized by an analog-to-digital converter (ADC) and then processed by a modem to generate data embedded in the received signal. Usually, the receiver may be set in a relatively low power consumption configuration to process the target RF received signal, as the power level of the target RF received signal is often predictable and controlled to allow wireless communication device to operate in a power efficient manner.

Often, when a jammer is present at the input of a receiver, the components (e.g., low noise amplifier (LNA), mixer, baseband filter (BBF)) of the receiver have to be reconfigured to handle the jammer. This is because the power level of the jammer may be significantly higher than the target RF received signal; and thus, the jammer results in the receiver components operating in high compression regions, which may lead to significant loss in signal to noise ratio (SNR) and increased block error rate (BER or BLER). The reconfiguration typically involves increasing the supply voltage to the active components of the receiver, such as the LNA and the BBF (and possibly the mixer if it is an active mixer) to increase their one decibel (1 dB) compression points to prevent the jammer from causing these active devices to operate at undesirable high compression regions.

One solution is to maintain the supply voltage to the active devices at relatively high levels continuously to handle jammers when they are present. However, when jammers are not present, this results in a power inefficient manner to operate the receiver, which has the adverse consequence of reducing the battery life. Another solution is to add sharp RF filters at the front end of a receiver. However, RF filters impact the gain and noise performance of the receiver, and occupies significant circuit area and are typically expensive.

Certain aspects of the disclosure relate to detecting the presence of an RF jammer at an input of a receiver, providing a relatively low supply voltage to one or more active receiver components (e.g., LNA, BBF, etc.) when an RF jammer is not detected at the input of the receiver to operate the receiver in a power efficient manner, and providing a relatively high supply voltage to the one or more active receiver components (e.g., LNA, BBF, etc.) when an RF jammer is detected at the input of the receiver to increase their 1 dB compression points to prevent degradation in the SNR and BER performance of the receiver. Other related features and details are further described herein.

Figure 1:
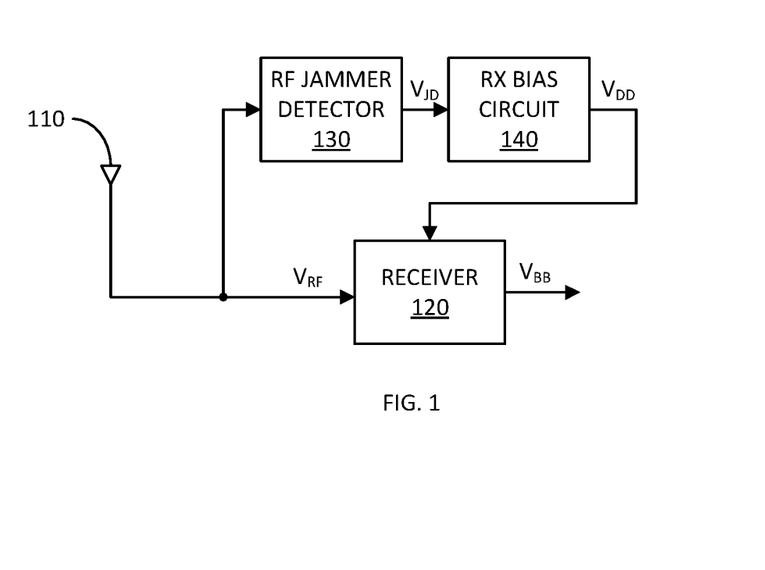
FIG. 1 illustrates a block diagram of an example apparatus for wireless communication in accordance with an aspect of the disclosure.

FIG. 1 illustrates a block diagram of an example apparatus for wireless communication 100 in accordance with an aspect of the disclosure. The apparatus 100 includes an antenna 110, a receiver 120, a radio frequency (RF) jammer detector 130, and a receiver bias circuit 140. The antenna 110 is configured to wirelessly receive an input RF signal $V_{RF}$. The receiver 120, which includes an input coupled to the antenna 110, is configured to process the input RF signal $V_{RF}$ to generate a baseband signal $V_{BB}$.

The RF jammer detector 130, which includes an input coupled to the input of the receiver 120, is configured to generate a signal $V_{JD}$ indicative of whether an RF jammer is present at the input of the receiver 120. The RF jammer detector 130 may include a filter to limit detection of RF jammers to a particular frequency range. The receiver bias circuit 140, which includes an input coupled to an output (at which the RF jammer indication signal $V_{JD}$ is generated) of the RF jammer detector 130, is configured to generate at least one supply voltage $V_{DD}$ for at least one active component of the receiver 120 based on the RF jammer indication signal $V_{JD}$. As discussed further herein, the at least one active component of the receiver 120 may include a low noise amplifier (LNA), a mixer, a baseband filter (BBF), or an analog-to-digital converter (ADC).

In operation, if there is no RF jammer at the input of the receiver 120, the RF jammer detector 130 generates the RF jammer indication signal $V_{JD}$ at a deasserted level (e.g., a logic zero (0)). In response to the deasserted RF jammer indication signal $V_{JD}$, the receiver bias circuit 140 generates the at least one supply voltage $V_{DD}$ at a relatively low voltage level (e.g., 0.8V). Accordingly, the at least one active component of the receiver 120 may process the input RF signal $V_{RF}$ with a relatively low 1 dB compression point due to the relatively low supply voltage $V_{DD}$, and achieve the target SNR and BER performance for the receiver 120, while conserving power with the relatively low supply voltage $V_{DD}$.

If, on the other hand, there is an RF jammer at the input of the receiver 120, the RF jammer detector 130 generates the RF jammer indication signal $V_{JD}$ at an asserted level (e.g., a logic one (1)). In response to the asserted RF jammer indication signal $V_{JD}$, the receiver bias circuit 140 generates the at least one supply voltage $V_{DD}$ at a relatively high voltage level (e.g., 1.2V). Accordingly, the at least one active component of the receiver 120 may process the desired or target RF received signal $V_{RF}$ with a relatively high 1 dB compression point due to the relatively high supply voltage $V_{DD}$, and achieve the target SNR and BER performance for the receiver 120 even though an RF jammer is present at the input of the receiver 120.

Thus, the apparatus 100 is able to achieve the target SNR and BER performance in the presence of an RF jammer, while operating in a power efficient manner in the absence of an RF jammer.

Figure 2:
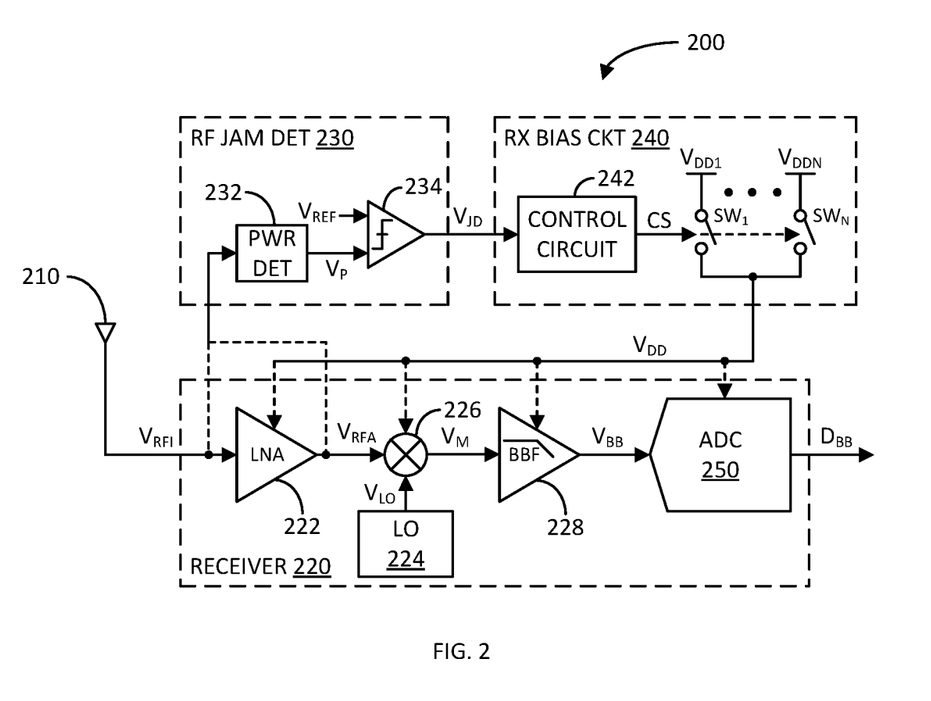
FIG. 2 illustrates a schematic diagram of another example apparatus for wireless communication in accordance with another aspect of the disclosure.

FIG. 2 illustrates a schematic diagram of another example apparatus for wireless communication 200 in accordance with another aspect of the disclosure. The apparatus 200 may be an example more detailed implementation of the apparatus 100. In particular, the apparatus 200 includes an antenna 210, a receiver 220, an RF jammer detector 230, and a receiver bias circuit 240.

Similarly, the antenna 210 is configured to wirelessly receive an input RF signal $V_{RFI}$. The receiver 220, which includes an input coupled to the antenna 210, is configured to process the input RF signal $V_{RFI}$ to generate a baseband signal $V_{BB}$. The RF jammer detector 230, which includes an input coupled to the input of the receiver 220, is configured to generate a signal $V_{JD}$ indicative of whether an RF jammer is present at the input of the receiver 220. The receiver bias circuit 240, which includes an input coupled to an output (at which the RF jammer indication signal $V_{JD}$ is generated) of the RF jammer detector 230, is configured to generate at least one supply voltage $V_{DD}$ for at least one active component of the receiver 220 based on the RF jammer indication signal $V_{JD}$.

More specifically, the receiver 220 includes a low noise amplifier (LNA) 222, a mixer 226, a local oscillator (LO) 224, a baseband filter (BBF) 228, and an analog-to-digital converter (ADC) 230. The LNA 222 is configured to amplify the input RF signal $V_{RFI}$ to generate an amplified RF signal $V_{RFA}$. The LO 224 is configured to generate an LO (e.g., sinusoidal) signal $V_{LO}$. The mixer 226 is configured to mix the amplified RF signal $V_{RFA}$ with the LO signal $V_{LO}$ to generate a mixed signal $V_M$. The mixed signal $V_M$ includes an upper frequency component with a frequency being the sum of the respective frequencies of the amplified RF signal $V_{RF4}$ and the LO signal $V_{LO}$, and a lower frequency component with a frequency being the difference of the respective frequencies of the amplified RF signal $V_{RF4}$ and the LO signal $V_{LO}$. The BBF 228 is configured to filter (e.g., low pass filter) the mixed signal $V_M$ (e.g., to substantially remove the upper frequency component, while substantially not affecting the lower frequency component) to generate the baseband signal $V_{BB}$. The ADC 250 is configured to digitize the baseband signal $V_{BB}$ to generate a digital baseband signal $D_{BB}$.

The RF jammer detector 230 includes a power detector 232 including an input (which serves as the input of the RF jammer detector 230) coupled to the input of the receiver 220; or more specifically, to the input of the LNA 222, as indicated by a dash line. Alternatively, the input of the power detector 232 may be coupled to the output of the LNA 222, as indicated by another dash line. The power detector 232 is configured to rectify the RF signal at the input or output of the LNA 222 to generate a signal $V_P$ indicative of a power level at the input of the receiver 220. In the case where the input of the power detector 232 is coupled to the input of the receiver 220, the amplitude of the power level signal $V_P$ is related to the RF power level at the input of the receiver 220 based on the conversion gain of the power detector 232. In the case where the input of the power detector 232 is coupled to the output of the LNA 222, the amplitude of the power level signal $V_P$ is related to the RF power level at the input of the receiver 220 based on the conversion gain of the power detector 232 multiplied by the gain (G) of the LNA 222. Accordingly, the dynamic range of the power level signal $V_P$ when the input of the power detector 232 is coupled to the output of the LNA 222 is G times the dynamic range of the power level signal $V_P$ when the input of the power detector 232 is coupled to the input of the receiver 220.

The RF jammer detector 230 further includes a comparator 234 including a first input coupled to an output (at which the power level signal $V_P$ is generated) of the power detector 232 and a second input to receive a reference voltage $V_{REF}$, which serves as a threshold related to whether an RF jammer is present at the input of the receiver 220. The comparator 234 is configured to generate the RF jammer indication signal $V_{JD}$ based on a comparison of the power level signal $V_P$ and the threshold $V_{REF}$. For example, if the power level signal $V_P$ is less than the threshold $V_{REF}$, then the comparator 234 generates a deasserted RF jammer indication signal $V_{JD}$ (e.g., a logic zero (0)); which indicates no RF jammer is present at the input of the receiver 220. If the power level signal $V_P$ is greater than the threshold $V_{REF}$, then the comparator 234 generates an asserted RF jammer indication signal $V_{JD}$ (e.g., a logic one (1)); which may indicate the presence of an RF jammer at the input of the receiver 220.

The receiver bias circuit 240 includes a control circuit 242 configured to generate a control signal (CS) based on the RF jammer indication signal $V_{JD}$. Accordingly, the control circuit 242 includes an input coupled to an output (at which the RF jammer indication signal $V_{JD}$ is generated) of the RF jammer detector 230. The receiver bias circuit 240 further includes a set of supply voltage rails configured to receive a set of supply voltages $V_{DD1}$ to $V_{DDN}$, respectively. Additionally, the receiver bias circuit 240 includes a set of switching devices $SW_1$ to $SW_N$ coupled between the $V_{DD1}$ to $V_{DDN}$ voltage rails and an output of the receiver bias circuit 240, respectively. The control signal CS generated by the control circuit 242 controls the state (open or closed) of the set of switching devices $SW_1$ to $SW_N$. Accordingly, the set of switching devices $SW_1$ to $SW_N$, which may each be configured as a field effect transistor (FET), includes control inputs (e.g., gates) coupled to an output (at which the control signal CS is generated) of the control circuit 242.

As an example, the receiver bias circuit 240 includes two supply voltage rails $V_{DD1}$ and $V_{DD2}$ and two switching devices $SW_1$ and $SW_2$ (e.g., N=2). The supply voltage $V_{DD2}$ (e.g., 1.2V) may be greater than the supply voltage $V_{DD1}$ (e.g., 0.8V). If the RF jammer indication signal $V_{JD}$ is deasserted (indicating that there is no RF jammer present at the input of the receiver 220), the control circuit 242 generates the control signal CS to close the switching device $SW_1$ and open the switching device $SW_2$. Accordingly, the receiver bias circuit 240 selects $V_{DD1}$ (e.g., 0.8V) as the output supply voltage $V_{DD}$. If the RF jammer indication signal $V_{JD}$ is asserted (indicating that there is an RF jammer present at the input of the receiver 220), the control circuit 242 generates the control signal CS to open the switching device $SW_1$ and close the switching device $SW_2$. Accordingly, the receiver bias circuit 240 selects $V_{DD2}$ (e.g., 1.2V) as the output supply voltage $V_{DD}$.

Although, in the above example, N=2, it shall be understood that N can be any number. However, if N is greater than two, the RF jammer detector 230 may be configured to compare the power level signal $V_P$ to a set of different reference voltages or thresholds (e.g., N−1). Accordingly, the RF jammer indication signal $V_{JD}$ may indicate N multiple levels of RF jammers at the input of the receiver 220. In this regard, the control signal CS generated by the control circuit CS controls the states of the switching devices $SW_1$ to $SW_N$ based on the RF jammer level indicated by the RF jammer indication signal $V_{JD}$.

The supply voltage $V_{DD}$ outputted by the receiver bias circuit 240 may be provided to one or more active components of the receiver 220, such as the LNA 222, the mixer 226 (if it is an active mixer), the BBF 228, or the ADC 250. Accordingly, the output of the receiver bias circuit 240 may be coupled to supply voltage input(s) of the LNA 222, mixer 226, and/or BBF 228. Thus, the LNA 222 amplifies the input RF signal $V_{RFI}$ based on the supply voltage $V_{DD}$, the mixer 226 may mix the amplified RF signal $V_{RF4}$ with the LO signal $V_{LO}$ based on the supply voltage $V_{DD}$, the BBF 228 may filter the mixed signal $V_M$ based on the supply voltage $V_{DD}$, and/or the ADC 250 may digitize the baseband signal $V_{BB}$ to generate the digital baseband signal $D_{BB}$ based on the supply voltage $V_{DD}$. Although, in this example, the same supply voltage $V_{DD}$ may be provided to the LNA 222, mixer 226, and BBF 228, it shall be understood that the receiver bias circuit 240 may be configured to supply different supply voltages to the LNA 222, mixer 226, and BBF 228 for all implementations described herein, respectively. For example, the apparatus 200 may further include a set of receiver bias circuits for generating the different supply voltages for the LNA 222, mixer 226, and BBF 228, respectively. In other words, the apparatus 200 may further include a set of one or more other receiver bias circuits including a set of one or more other supply voltage outputs coupled to one or more other supply voltage inputs (e.g., of the LNA 222, mixer 226, and/or BBF 228) of the receiver 220.

In operation, if there is no RF jammer at the input of the receiver 220, the power level signal $V_P$ is less than the threshold $V_{REF}$. Accordingly, the RF jammer detector 230 generates the RF jammer indication signal $V_{JD}$ at a deasserted level (e.g., a logic zero (0)). In response, the control circuit 242 generates the control signal CS to close the switching device $SW_1$ and open the switching device $SW_2$. Thus, the receiver bias circuit 240 selects $V_{DD1}$ as the output supply voltage $V_{DD}$ (e.g., 0.8V). Accordingly, the LNA 220, mixer 226, and/or BBF 228 may process the input RF signal $V_{RFI}$ with a relatively low 1 dB compression point, and achieve the target SNR and BER performance for the receiver 220, while conserving power with the relatively low supply voltage $V_{DD}$.

If, on the other hand, there is an RF jammer at the input of the receiver 220, the power level signal $V_P$ is greater than the threshold $V_{REF}$. Accordingly, the RF jammer detector 230 generates the RF jammer indication signal $V_{JD}$ at an asserted level (e.g., a logic one (1)). In response, the control circuit 242 generates the control signal CS to open the switching device $SW_1$ and close the switching device $SW_2$. Thus, the receiver bias circuit 240 selects $V_{DD2}$ as the output supply voltage $V_{DD}$ (e.g., 1.2V). Accordingly, the LNA 220, mixer 226, and/or BBF 228 may process the input RF signal $V_{RFI}$ with a relatively high 1 dB compression point, and achieve the target SNR and BER performance for the receiver 220 even though an RF jammer is present at the input of the receiver 220.

Thus, the apparatus 200 is able to achieve the target SNR and BER performance in the presence of an RF jammer, while operating in a power efficient manner in the absence of an RF jammer.

Figure 3:
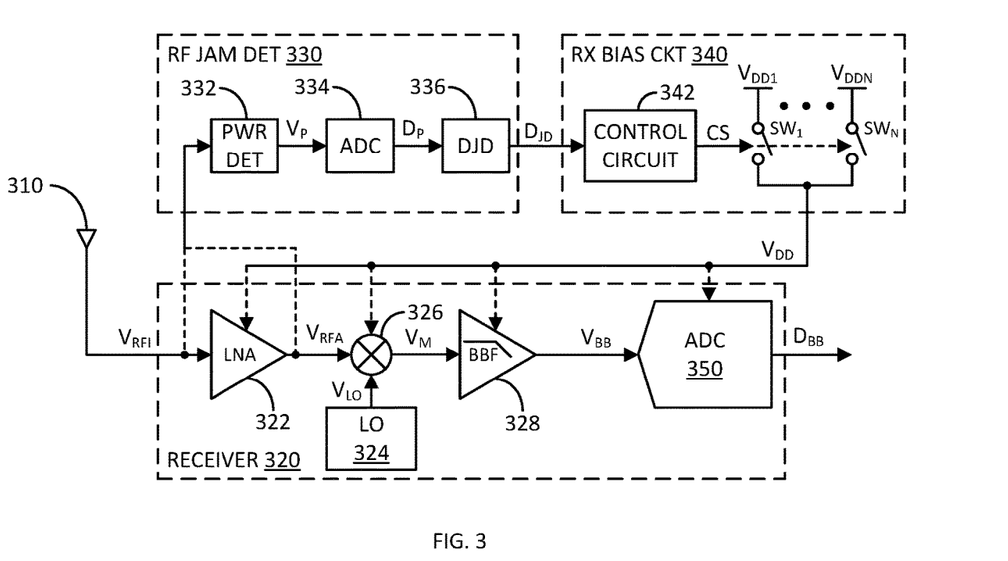
FIG. 3 illustrates a schematic diagram of another example apparatus for wireless communication in accordance with another aspect of the disclosure.

FIG. 3 illustrates a schematic diagram of another example apparatus for wireless communication 300 in accordance with another aspect of the disclosure. The apparatus 300 is a variation of the apparatus 200 previously discussed. In particular, the apparatus 300 includes an RF jammer detector 330 that is more digitally configured than the RF jammer detector 230 of apparatus 200, which is more analog configured. The remaining components of the apparatus 300 are the same as the corresponding ones in apparatus 200, as indicated by the same reference numbers but with the most significant digit being a "3" in apparatus 300 instead of a "2" as in apparatus 200.

More specifically, the RF jammer detector 330 includes a power detector 332, an analog-to-digital converter (ADC) 334, and a digital jammer detection (DJD) unit (e.g., a finite state machine (FSM), microcontroller, combinational logic, or other digital device) 336. The power detector 332 may be configured similar to power detector 232 previously discussed; that is, the power detector 332 includes an input coupled to the input or output of the LNA 322, and is configured to generate a power level signal $V_P$ indicative of the RF power level at the input of the receiver 320, as previously discussed. The ADC 334 is configured to digitize the power level signal $V_P$ to generate a power level digital value $D_P$. Accordingly, the ADC 334 includes an input coupled to an output (at which the power level signal $V_P$ is generated) of the power detector 332.

The digital jammer detection unit 336 is configured to generate a digital RF jammer indication signal $D_{JD}$ based on the power level digital value $D_P$. Accordingly, the digital jammer detection unit 336 includes an input coupled to an output (at which the digital value $D_P$ is generated) of the ADC 334. With regard to the receiver bias circuit 340, the control circuit 342 is configured to generate the control signal CS based on the digital RF jammer indication signal $D_{JD}$. Accordingly, the control circuit 342 includes an input coupled to an output (at which the digital RF jammer indication signal $D_{JD}$ is generated) of the FSM 336.

Figure 4:
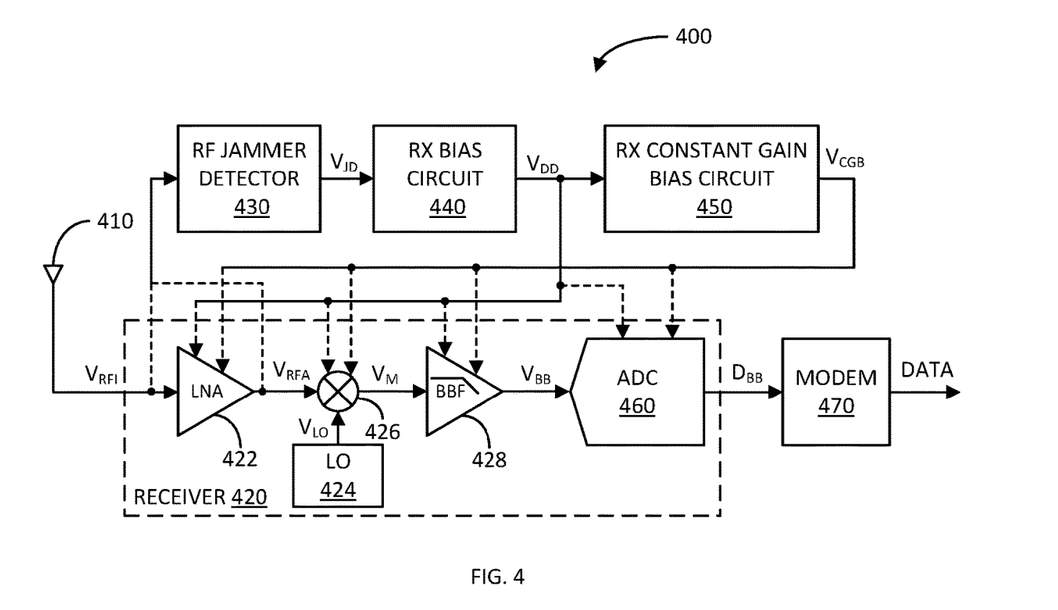
FIG. 4 illustrates a schematic diagram of another example apparatus for wireless communication in accordance with another aspect of the disclosure.

FIG. 4 illustrates a schematic diagram of another example apparatus for wireless communication 400 in accordance with another aspect of the disclosure. The apparatus 400 may be a variation of any of the apparatuses previously discussed. In apparatus 400, the cumulative gain of the receiver is made substantially constant, independent of the supply voltage $V_{DD}$ provided to the active component(s) of the receiver. This is done so that changing the supply voltage $V_{DD}$ due to the presence or absence of an RF jammer at the input of the receiver is substantially transparent to an analog-to-digital converter (ADC) and modem downstream of the receiver.

More specifically, the apparatus 400 includes an antenna 410, a receiver 420, an RF jammer detector 430, a receiver bias circuit 440, a receiver constant gain bias circuit 450, and a modem 470. The receiver 420, in turn, includes an LNA 422, an LO 424, a mixer 426, a BBF 428, and an analog-to-digital converter (ADC) 460.

As in the previous receivers, the receiver 420 is configured to process an input RF signal $V_{RFI}$ to generate a baseband signal $V_{BB}$, which may be digitized as a digital baseband signal $D_{BB}$ by the ADC 460. The RF jammer detector 430, which includes an input coupled to the input or output of the LNA 422, is configured to generate an RF jammer indication signal $V_{JD}$ indicative of whether there is an RF jammer at the input of the receiver 420. The RF jammer detector 430 may be configured similar to RF jammer detector 230 or 330 previously discussed. The receiver bias circuit 440 is configured to generate a supply voltage $V_{DD}$ based on the RF jammer indication signal $V_{JD}$, as previously discussed. The receiver bias circuit 440 may be configured similar to receiver bias circuit 240 or 340 previously discussed. The supply voltage $V_{DD}$ may be provided to at least one of the LNA 422, mixer 426, BBF 428, or ADC 460. The modem 470 is configured to process the digital baseband signal $D_{BB}$ (e.g., frame detection and processing, synchronization, channel equalization, spatial processing, demodulation, decoding, etc.) to generate data.

As discussed, so that changing of the supply voltage $V_{DD}$ applied to the LNA 422, mixer 426, and/or BBF 428 due to the presence or absence of an RF jammer at the input of the receiver 420 is substantially transparent to the ADC 460 and modem 470, the cumulative gain ($G_C$) of the receiver should be maintained substantially constant. In this example, the cumulative gain $G_C$ is a summation of a gain ($G_1$) of the LNA 422, a gain ($G_2$) of the mixer 426, and a gain ($G_3$) of the BBF 228 (e.g., $G_C=G_1+G_2+G_3$). To effectuate the constant cumulative gain $G_C$, the receiver constant gain bias circuit 450 is configured to generate a constant gain bias signal $V_{GCB}$ based on the supply voltage $V_{DD}$. The constant gain bias signal $V_{GCB}$ is provided to at least one of the LNA 422, mixer 426, BBF 428, or the ADC 460. The constant gain bias signal $V_{GCB}$ is configured to change the bias configuration of at least one of the LNA 422, mixer 426, BBF 428, or the ADC 460 to achieve a substantially constant cumulative gain $G_C$ for the receiver 420.

Although, in this example, the same constant gain bias signal $V_{GCB}$ is illustrated as being applied to the LNA 422, mixer 426, and/or BBF 428, it shall be understood that the receiver constant gain bias circuit 450 may generate different constant gain bias signals $V_{GCB}$ to effectuate the substantially constant cumulative gain $G_C$ for the receiver 420.

Considering an example, if the supply voltage $V_{DD}$ is raised due to the presence of an RF jammer at the input of the receiver 420, and the raising of the supply voltage $V_{DD}$ causes the gain $G_1$ of the LNA 422 to increase by one (1) dB (and the raising of the supply voltage $V_{DD}$ does not affect the gains $G_2$ and $G_3$ of the mixer 426 and the BBF 428, respectively), the constant gain bias signal $V_{GCB}$ generated by receiver constant gain bias circuit 450 may change the bias configuration of the LNA 422 (e.g., changing the current supplied to the LNA 422) so that the gain due to the constant gain bias signal $V_{GCB}$ is reduced by substantially one (1) dB to maintain the gain $G_1$ of the LNA 422 substantially constant; and consequently, the cumulative gain $G_C$ of the receiver 420 substantially constant.

Considering another example, if the supply voltage $V_{DD}$ is raised due to the presence of an RF jammer at the input of the receiver 420, and the raising of the supply voltage $V_{DD}$ causes the gain $G_1$ of the LNA 422 to increase by one (1) dB (and the supply voltage $V_{DD}$ is not applied to the mixer 426 and the BBF 428), the constant gain bias signal $V_{GCB}$ generated by receiver constant gain bias circuit 450 may change the bias configuration of the BBF 428 (e.g., changing the supply voltage or current applied to the BBF 428) so that its gain $G_2$ is reduced by substantially one (1) dB to maintain the cumulative gain $G_C$ of the receiver 420 substantially constant.

Figure 5:
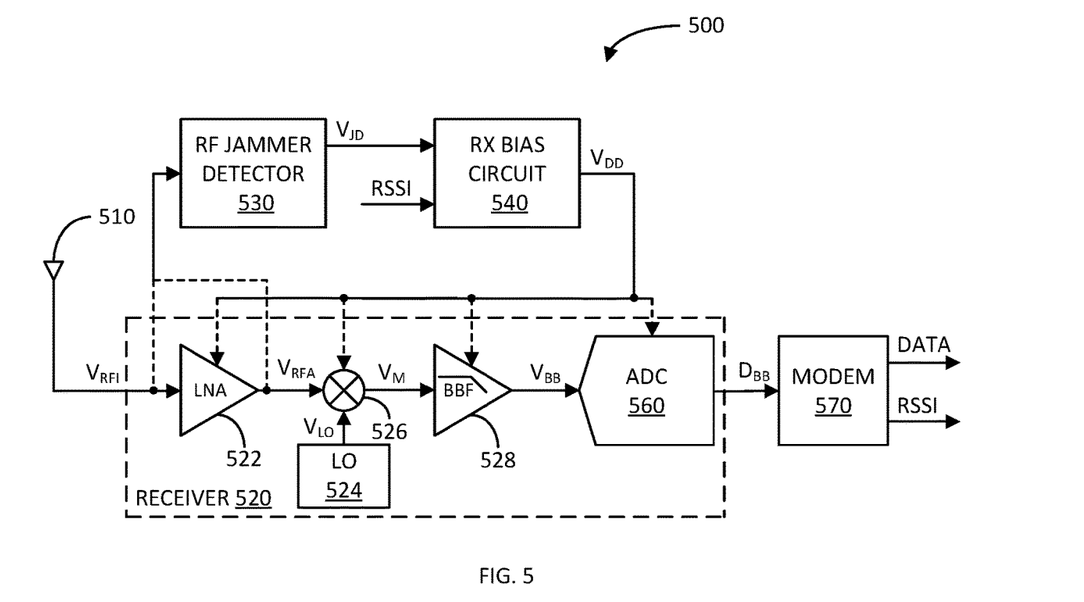
FIG. 5 illustrates a schematic diagram of another example apparatus for wireless communication in accordance with another aspect of the disclosure.

FIG. 5 illustrates a schematic diagram of another example apparatus for wireless communication 500 in accordance with another aspect of the disclosure. The apparatus 400 may be a variation of any of the apparatuses previously discussed. In apparatus 500, the receiver bias circuit 540 may disable its changing of the supply voltage $V_{DD}$ based on the RF jammer indication signal $V_{JD}$ based on a power level of the target received signal as indicated by a received signal strength indicator (RSSI) or other similar parameter. This may be done so that if the apparatus 500 is close to a base station, the relatively high-power level of the target received signal from the base station does not produce a false positive of the RF jammer indication signal $V_{JD}$. In this regard, if the RSSI or other similar parameter is above a threshold, the receiver bias circuit 540 maintains the supply voltage $V_{DD}$ at the relatively low voltage level even though the RF jammer indication signal $V_{JD}$ is asserted.

More specifically, the apparatus 500 includes an antenna 510, a receiver 520, an RF jammer detector 530, a receiver bias circuit 540, and a modem 570. The receiver 520, in turn, includes an LNA 522, an LO 524, a mixer 526, a BBF 528, and an analog-to-digital converter (ADC) 560. In this example, not only does the modem 570 process the digital baseband signal $D_{BB}$ from the ADC 560 to generate data, the modem 570 also generates an RSSI signal indicative of the power level of the target received RF signal at the input of the receiver 520. In many receivers, the modem 570 already generates the RSSI signal for automatic gain control (AGC) or other purposes, but in apparatus 500, the RSSI signal is also applied to the receiver bias circuit 540.

That is, if the power level of the target received RF signal, as indicated by the RSSI signal, is at or above a threshold, the receiver bias circuit 540 maintains the supply voltage $V_{DD}$ for at least one of the LNA 522, mixer 526, BBF 528, or the ADC 560 at the relatively low voltage level independent of the RF jammer indication signal $V_{JD}$; that is, even though the RF jammer indication signal $V_{JD}$ is asserted. As discussed, this prevents unnecessarily raising the supply voltage $V_{DD}$ when the apparatus 500 is close to the base station, and the power level of the target received RF signal triggers the RF jammer detector 530.

Figure 6:
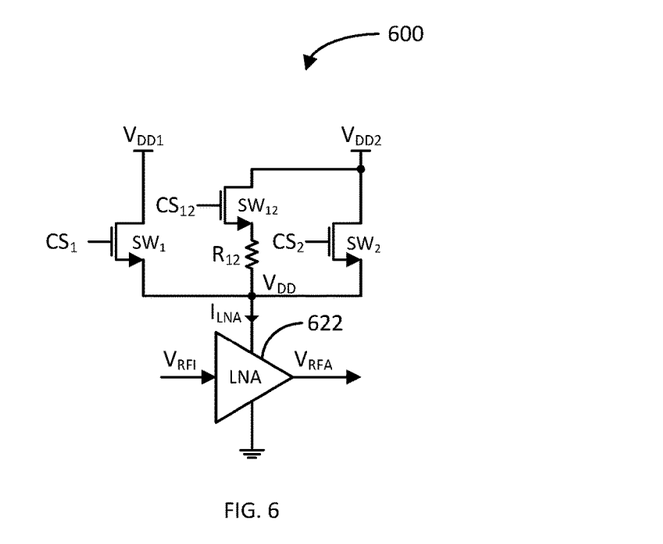
FIG. 6 illustrates a schematic diagram of an example receiver bias circuit coupled to an LNA (or other receiver active device) in accordance with another aspect of the disclosure.

FIG. 6 illustrates a schematic diagram of an example receiver bias circuit 600 coupled to an LNA 622 (or other receiver active device) in accordance with another aspect of the disclosure. In summary, when the receiver bias circuit 600 changes a supply voltage $V_{DD}$ for the LNA 622 in response to an RF jammer indication signal $V_{JD}$ as previously discussed, the receiver bias circuit 600 may change the supply voltage $V_{DD}$ from a first voltage level to a second voltage level in one or more steps or using one or more transition voltage levels. This reduces the likelihood that the abrupt change in the supply voltage $V_{DD}$ causes the voltages across the devices (e.g., FETs) of the LNA or other active device to exceed their reliability limits during the supply voltage $V_{DD}$ transition.

More specifically, the receiver bias circuit 600 includes first and second supply voltage rails configured to receive supply voltages $V_{DD1}$ and $V_{DD2}$, respectively. As an example, the supply voltage $V_{DD1}$ (e.g., 0.8V) may be the one provided to the LNA 622 when no RF jammer has been detected at the input of the LNA 622. The supply voltage $V_{DD2}$ (e.g., 1.2V) may be the one provided to the LNA 622 when an RF jammer has been detected at the input of the LNA 622. The receiver bias circuit 600 further includes a first switching device $SW_1$ and a second switching device $SW_2$ coupled between the $V_{DD1}$ and $V_{DD2}$ supply voltage rails and a supply voltage input of the LNA 622, respectively. Each of the switching devices $SW_1$ and $SW_2$ may be configured as an n-channel metal oxide semiconductor field effect transistor (NMOS FET). The control inputs or gates of the switching devices $SW_1$ and $SW_2$ are configured to respectively receive components $CS_1$ and $CS_2$ of the control signal CS generated by the control circuit 242 or 342 previously discussed.

To effectuate a transition or step supply voltage $V_{DD}$ for the LNA 622 during the transition from $V_{DD1}$ to $V_{DD2}$, or vice-versa, the receiver bias circuit 600 further includes a third switching device $SW_{12}$ and a resistor $R_{12}$ coupled in series between the $V_{DD2}$ supply voltage rail and the supply voltage input of the LNA 622. The third switching device $SW_{12}$ may also be configured as an NMOS FET including a control input or gate configured to receive another component $CS_{12}$ of the control signal CS generated by the control circuit 242 or 342. The resistance of the resistor $R_{12}$ may be selected to achieve a supply voltage $V_{DD}$ (e.g., 1.0V) between $V_{DD1}$ (e.g., 0.8V) and $V_{DD2}$ (e.g., 1.2V) based on a current $I_{LNA}$ drawn by the LNA 622 (e.g., $V_{DD}=V_{DD2}-(I_{LNA}*R_{12})$, assuming the turn-on resistance of the switching device $SW_{12}$ is negligible).

Thus, when transitioning the supply voltage $V_{DD}$ from $V_{DD1}$ to $V_{DD2}$, the control circuit 242 or 342 initially generates control signals $CS_1$, $CS_{12}$ and $CS_2$ to close switching device $SW_1$ and open switching devices $SW_2$ and $SW_{12}$ to set $V_{DD}$ at $V_{DD}$. Then, pursuant to the transition, the control circuit 242 or 342 generates the control signals $CS_1$, $CS_{12}$ and $CS_2$ to close switching device $SW_{12}$ and open switching devices $SW_1$ and $SW_2$ to set $V_{DD}$ between $V_{DD1}$ and $V_{DD2}$. Then, pursuant to the transition, the control circuit 242 or 342 generates the control signals $CS_1$, $CS_{12}$ and $CS_2$ to close switching device $SW_2$ and open switching devices $SW_1$ and $SW_{12}$ to set $V_{DD}$ at $V_{DD2}$.

Similarly, when transitioning the supply voltage $V_{DD}$ from $V_{DD2}$ to $V_{DD1}$, the control circuit 242 or 342 initially generates control signals $CS_1$, $CS_{12}$ and $CS_2$ to close switching device $SW_2$ and open switching devices $SW_1$ and $SW_{12}$ to set $V_{DD}$ at $V_{DD2}$. Then, pursuant to the transition, the control circuit 242 or 342 generates the control signals $CS_1$, $CS_{12}$ and $CS_2$ to close switching device $SW_{12}$ and open switching devices $SW_1$ and $SW_2$ to set $V_{DD}$ between $V_{DD1}$ and $V_{DD2}$. Then, pursuant to the transition, the control circuit 242 or 342 generates the control signals $CS_1$, $CS_{12}$ and $CS_2$ to close switching device $SW_1$ and open switching devices $SW_2$ and $SW_{12}$ to set $V_{DD}$ at $V_{DD1}$.

Although, in this example, there are two supply voltage rails $V_{DD1}$ and $V_{DD2}$ (e.g., N=2), it shall be understood that there may be more than two supply voltage rails (e.g., N>2). In such case, the receiver bias circuit 600 may have a transitioning switching device/resistor per each distinct pair of supply voltage rails (e.g., N−1 transitioning switching device/resistor).

Figure 7A:
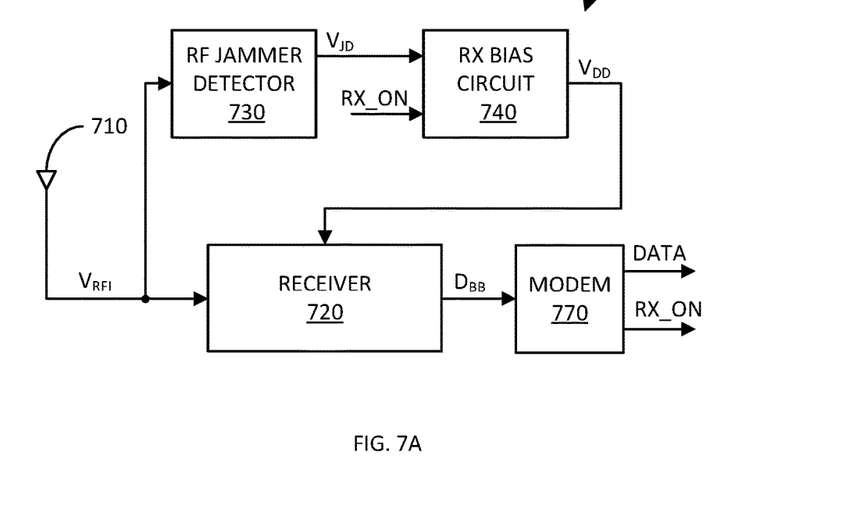
FIG. 7A illustrates a block diagram of another example apparatus for wireless communication in accordance with another aspect of the disclosure.

FIG. 7A illustrates a block diagram of another example apparatus for wireless communication 700 in accordance with another aspect of the disclosure. The apparatus 700 may be a variation of any of the apparatuses previously discussed. In apparatus 700, a receiver bias circuit 740 receives a receiver enable signal (e.g., RX_ON) that controls when to transition the supply voltage $V_{DD}$. Often, a base station transmits the target or download (DL) signal during transmission time intervals that are separated by non-transmission or partially-redundant transmission time intervals, sometimes referred to as cyclic prefix (CP) time intervals. It may be desirable for the receiver bias circuit 740 to perform the transition of the supply voltage $V_{DD}$ during the CP intervals even though an RF jammer or cessation of an RF jammer is detected during the DL time intervals. The signal RX_ON informs the receiver bias circuit 740 as to when these intervals occur.

More specifically, the apparatus 700 includes an antenna 710, a receiver 720, an RF jammer detector 730, a receiver bias circuit 740, and a modem 770. In this example, not only does the modem 770 process the digital baseband signal $D_{BB}$ from the receiver 720 to generate data, the modem 770 also generates the RX_ON signal as it is able to determine the DL and CP time intervals. That is, during each DL interval, the modem 770 maintains the RX_ON signal asserted, and during each CP interval, the modem 770 deasserts the RX_ON signal at the beginning of the CP interval, and then reasserts the RX_ON signal before the end of the CP interval. This is explained in more detail with reference to the following timing diagram.

Figure 7B:
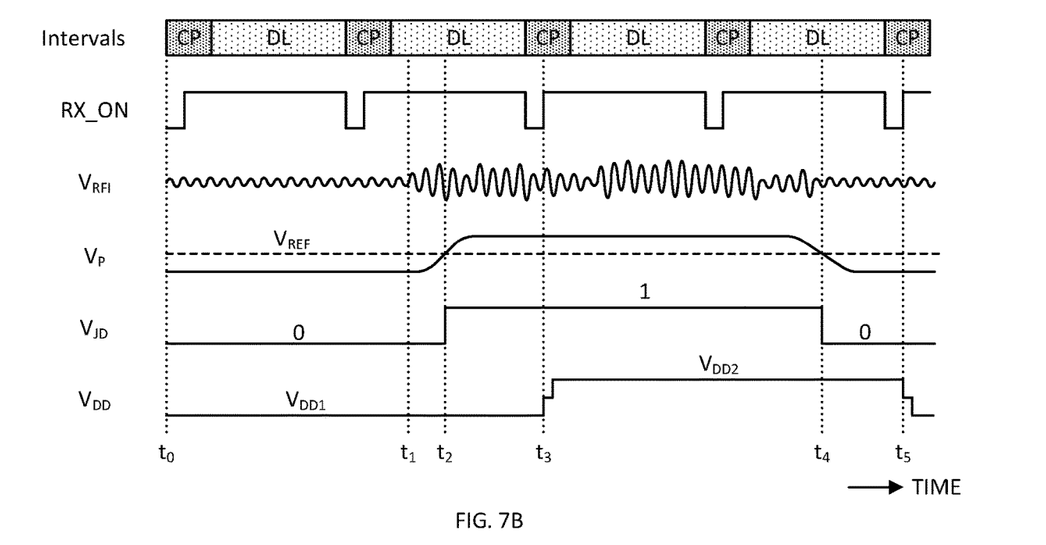
FIG. 7B illustrates a timing diagram of various signals related to an operation of the apparatus of FIG. 7A in accordance with another aspect of the disclosure.

FIG. 7B illustrates a timing diagram of various signals related to an operation of the apparatus 700 in accordance with another aspect of the disclosure. The x- or horizontal-axis represents time, and the y- or vertical-axis represents time intervals and amplitudes of various signals. For example, the top row of the timing diagram represents the CP and DL time intervals. The second row from the top represents the state or amplitude of the RX_ON signal. The third row from the top represents the amplitude of the input RF signal $V_{RFI}$. The fourth row from the top represents the amplitude of the power level signal $V_P$ generated internally within the RF Jammer 730. The fifth row from the top represents the state or amplitude of the RF jammer indication signal $V_{JD}$. And, the bottom row represents the voltage level of the supply voltage $V_{DD}$.

As illustrated, during time interval $t_0$-$t_1$, the input RF signal $V_{RFI}$ is related substantially to the DL signal transmitted by a base station, and there are no RF jammer present at the input of the receiver 720. Accordingly, the power level signal $V_P$ generated by the power detector internal to the RF jammer detector 730 is below the reference voltage or threshold $V_{REF}$. In response, the RF jammer detector 730 generates the RF jammer indication signal $V_{JD}$ at a deasserted level (e.g., logic zero (0)). In response to the deasserted level of the RF jammer indication signal $V_{JD}$, the receiver bias circuit 740 generates the supply voltage $V_{DD}$ for the receiver 720 at the relatively low voltage level $V_{DD1}$.

At time $t_1$, the antenna 710 picks up an RF jammer and provides it to the input of the receiver 720. As illustrated, at time $t_1$, the power level of the input RF signal $V_{RFI}$ begins to increase due to the RF jammer. In response, the power level signal $V_P$ generated by the power detector internal to the RF jammer detector 730 increases in amplitude. At time $t_2$, the power level signal $V_P$ crosses (rises above) the threshold $V_{REF}$ due to the RF jammer. In response, the RF jammer detector 730 generates the RF jammer indication signal $V_{JD}$ at an asserted level (e.g., logic one (1)). In response to the asserted level of the RF jammer indication signal $V_{JD}$ and the rising transition of the RX_ON signal at time $t_3$ during the third CP time interval, the receiver bias circuit 740 transitions the supply voltage $V_{DD}$ for the receiver 720 to the relatively high voltage level $V_{DD2}$. As illustrated, the receiver bias circuit 740 may set the supply voltage $V_{DD}$ to a transition voltage level between $V_{DD1}$ and $V_{DD2}$, as indicated by the step in $V_{DD}$ following time $t_3$.

Note that although the RF jammer indication signal $V_{JD}$ was asserted during the second DL time interval, the receiver bias circuit 740 did not respond to the asserted RF jammer indication signal $V_{JD}$ until the following CP time interval. This is done so that the supply voltage $V_{DD}$ is not changed during a DL interval so as to not disturb the receiving of the DL signal.

At time $t_4$, the RF jammer ceases to be present at the input of the receiver 720. As illustrated, at time $t_4$, the power level signal $V_P$ decreases below the threshold $V_{REF}$. In response, the RF jammer detector 730 generates the RF jammer indication signal $V_{JD}$ at the deasserted level (e.g., logic zero (0)). In response to the deasserted level of the RF jammer indication signal $V_{JD}$ and the rising transition of the RX_ON signal at time $t_5$ during the fifth CP time interval, the receiver bias circuit 740 transitions the supply voltage $V_{DD}$ for the receiver 720 to the relatively low voltage level $V_{DD1}$. As illustrated, the receiver bias circuit 740 may set the supply voltage $V_{DD}$ to a transition voltage level between $V_{DD2}$ and $V_{DD1}$, as indicated by the step in $V_{DD}$ following time $t_5$.

Note that although the RF jammer indication signal $V_{JD}$ was deasserted during the fourth DL time interval, the receiver bias circuit 740 did not respond to the deasserted RF jammer indication signal $V_{JD}$ until the following CP time interval. This is done so that the supply voltage $V_{DD}$ is not changed during a DL interval so as to not disturb the receiving of the DL signal.

Figure 8:
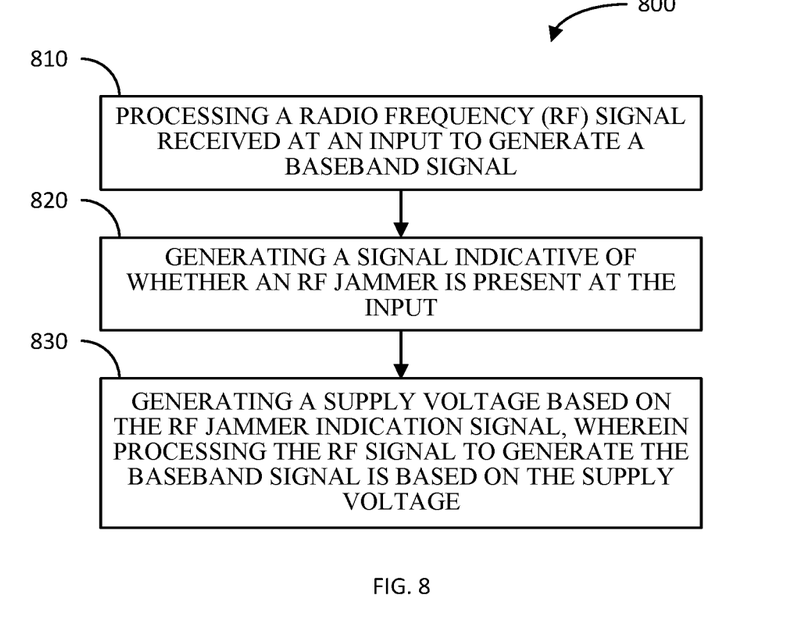
FIG. 8 illustrates a flow diagram of an example method of processing a radio frequency (RF) signal in accordance with another aspect of the disclosure.

FIG. 8 illustrates a flow diagram of an example method 800 of processing a radio frequency (RF) signal in accordance with another aspect of the disclosure. The method 800 includes processing a radio frequency (RF) signal received at an input to generate a baseband signal (block 810). Examples of a means for processing a radio frequency (RF) signal received at an input to generate a baseband signal include any of the receivers described herein. More specifically, the processing of the RF signal to generate the baseband signal may include amplifying the RF signal to generate an amplified RF signal; mixing the amplified RF signal with a local oscillator (LO) signal to generate a mixed signal; and filtering the mixed signal to generate the baseband signal, wherein at least one of the amplifying, mixing, or filtering is based on the supply voltage. Related to the processing of the RF signal, the method 800 may include maintaining a gain, associated with processing the RF signal to generate the baseband signal, substantially constant and independent of the supply voltage.

The method 800 further includes generating a signal indicative of whether an RF jammer is present at the input (block 820). Examples of a means for generating a signal indicative of whether an RF jammer is present at the input include any of the RF jammer detectors described herein.

Additionally, the method 800 includes generating a supply voltage based on the RF jammer indication signal, wherein processing the RF signal to generate the baseband signal is based on the supply voltage (block 830). Examples of a means for generating a supply voltage based on the RF jammer indication signal include any of the receiver bias circuits described herein. The operation of generating the supply voltage may include generating the supply voltage at a first voltage level in response to the RF jammer indication signal indicating that the RF jammer is present at the input; and generating the supply voltage at a second voltage level in response to the RF jammer indication signal indicating that the RF jammer is not present at the input, wherein the first voltage level is higher than the second voltage level.

Additionally, the operation of generating the supply voltage may include generating the supply voltage at a transition voltage level between the first and second voltage levels. Further, the operation of generating the supply voltage includes changing the supply voltage during a cyclic prefix (CP) time interval between two downlink (DL) time intervals. Also, the operation of generating the supply voltage may include not generating the supply voltage based on the RF jammer indication signal in response to a power level of a target RF received signal at or above a threshold.

Figure 9:
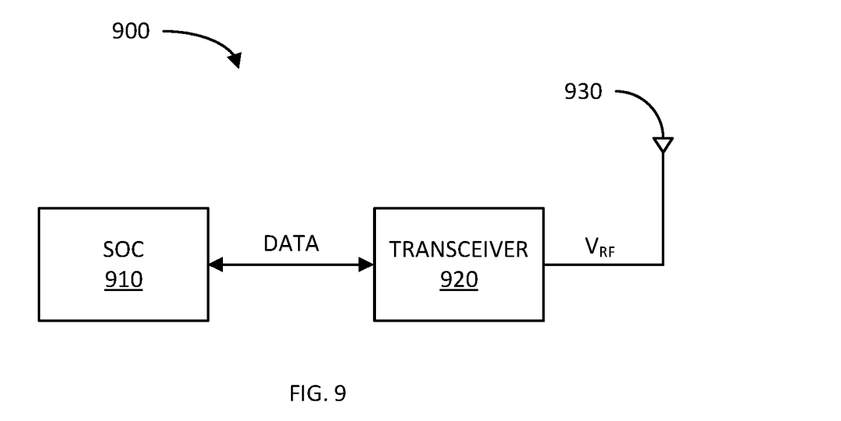
FIG. 9 illustrates a block diagram of an example wireless communication device in accordance with another aspect of the disclosure.

FIG. 9 illustrates a block diagram of an example wireless communication device 900 in accordance with another aspect of the disclosure. The wireless communication device 900 may be any type of wireless communication device, such as a smart phone, desktop computer, laptop computer, tablet devices, smart watches, Internet of Things (IoT), and others.

The wireless communication device 900 includes an integrated circuit (IC) 910, which may be configured as a system on chip (SOC). The SOC 910 is configured to process data based on a number of applications. The wireless communication device 900 further includes a transceiver 920. The transceiver 920 may be configured to receive a data signal from the SOC 910 and convert it into an RF signal $V_{RF}$ for wireless transmission to a remote wireless communication device via at least one antenna 930.

The transceiver 920 may also be configured to receive an RF signal $V_{RF}$ from a remote wireless communication device via the at least one antenna 930, and process the RF signal to generate a data signal. In this regard, the transceiver 920 may include any of the apparatuses described herein. The transceiver 920 sends the data signal to the SOC 910 for processing based on a number of applications.

Implementation examples are in the following numbered clauses:

1. An apparatus, comprising:
   a receiver;
   a radio frequency (RF) jammer detector including an input coupled to the receiver; and
   a receiver bias circuit including an input coupled to an output of the RF jammer detector, and a supply voltage output, configured to produce an adjustable supply voltage, coupled to a supply voltage input of the receiver.

2. The apparatus of clause 1, wherein the receiver comprises a low noise amplifier (LNA), and wherein the input of the RF jammer detector is coupled to an input of the LNA.

3. The apparatus of clause 1, wherein the receiver comprises a low noise amplifier (LNA), and wherein the input of the RF jammer detector is coupled to an output of the LNA.

4. The apparatus of any of clauses 1-3, wherein the RF jammer detector comprises:
   a power detector, wherein an input of the power detector is the input of the RF jammer detector; and
   a comparator including a first input coupled to an output of the power detector, and a second input to receive a reference voltage, wherein an output of the comparator is the output of the RF jammer detector.

5. The apparatus of any of clauses 1-3, wherein the RF jammer detector comprises:
   a power detector, wherein an input of the power detector is the input of the RF jammer detector;
   an analog-to-digital converter (ADC) including an input coupled to an output of the power detector; and
   a digital jammer detection unit including an input coupled to an output of the ADC, wherein an output of the digital jammer detection unit is the output of the RF jammer detector.

6. The apparatus of any of clauses 1-5, wherein the receiver bias circuit comprises:
   a set of supply voltage rails to receive different supply voltages, respectively;
   a set of switching devices coupled between the set of supply voltage rails and the supply voltage output, respectively; and
   a control circuit, wherein an input of the control circuit is the input of the receiver bias circuit, and an output coupled to the set of switching devices, respectively.

7. The apparatus of clause 6, wherein the receiver comprises a low noise amplifier (LNA), and wherein the supply voltage input of the receiver comprises a supply voltage input of the LNA.

8. The apparatus of clause 6 or 7, wherein the receiver comprises a baseband filter, and wherein the supply voltage input of the receiver comprises a supply voltage input of the baseband filter.

9. The apparatus of any of clauses 6-8, wherein the receiver comprises a mixer, and wherein the supply voltage input of the receiver comprises a supply voltage input of the mixer.

10. The apparatus of any of clauses 6-9, wherein the receiver comprises an analog-to-digital converter (ADC), and wherein the supply voltage input of the receiver comprises a supply voltage input of the ADC.

11. The apparatus of any of clauses 6-10, wherein the control circuit includes another input to receive a signal indicative of a power level of a target received signal at an input of the receiver.

12. The apparatus of any of clauses 6-11, wherein the control circuit includes another input to receive a receiver enable signal.

13. The apparatus of any of clauses 6-12, wherein the receiver bias circuit further comprises an additional switching device coupled in series with a resistor between one of the set of supply voltage rails and the supply voltage output.

14. The apparatus of any of clauses 1-13, further comprising a modem including an input coupled to an output of the receiver.

15. The apparatus of any of clauses 1-14, wherein the input of the RF jammer detector is configured to receive and process an RF signal.

16. The apparatus of any of clauses 1-5, further comprising a set of one or more other receiver bias circuits including a set of one or more other supply voltage outputs coupled to one or more other supply voltage inputs of the receiver, respectively.

17. The apparatus of any of clauses 1-16, wherein the RF jammer detector includes a power detector configured to rectify an RF signal from the receiver to generate a signal indicative of a power level at an input of the receiver.

18. An apparatus, comprising:
   a receiver configured to process a radio frequency (RF) signal to generate a baseband signal;

a radio frequency (RF) jammer detector configured to process the RF signal to generate a signal indicative of whether an RF jammer is present at an input of the receiver; and a receiver bias circuit configured to generate a first supply voltage for the receiver based on the RF jammer indication signal.

19. The apparatus of clause 18, wherein the receiver bias circuit is configured to:

generate the first supply voltage at a first voltage level in response to the RF jammer indication signal indicating that the RF jammer is present at the input of the receiver; and generate the first supply voltage at a second voltage level in response to the RF jammer indication signal indicating that the RF jammer is not present at the input of the receiver, wherein the first voltage level is higher than the second voltage level.

20. The apparatus of clause 18 or 19, further comprising a receiver constant gain bias circuit configured to maintain a gain of the receiver substantially constant and independent of the first supply voltage.

21. The apparatus of any of clauses 18-20, wherein the receiver comprises a low noise amplifier (LNA) configured to amplify the RF signal based on the first supply voltage.

22. The apparatus of any of clauses 18-21, wherein the receiver comprises:

a local oscillator (LO) configured to generate an LO signal;

a mixer configured to mix the amplified RF signal with the LO signal to generate a mixed signal; and a baseband filter configured to filter the mixed signal to generate the baseband signal, wherein the receiver bias circuit is configured to generate a second supply voltage based on the RF jammer indication signal, and wherein the baseband filter is configured to filter the mixed signal based on the second supply voltage.

23. The apparatus of any of clauses 18-22, wherein the receiver bias circuit is configured to change the first supply voltage during a cyclic prefix (CP) time interval between two downlink (DL) time intervals.

24. The apparatus of any of clauses 18-23, wherein the receiver bias circuit is configured to disable the generating of the first supply voltage based on the RF jammer indication signal in response to a power level of a target received signal being at or above a threshold.

25. The apparatus of any of clauses 18-24, wherein the RF jammer detector comprises:

a power detector configured to generate a signal indicative of a power level of the RF signal at the input of the receiver; and a comparator configured to generate the RF jammer indication signal based on a comparison of the power level signal to a threshold.

26. The apparatus of any of clauses 18-24, wherein the RF jammer detector comprises:

a power detector configured to generate a signal indicative of a power level of the RF signal at the input of the receiver;

an analog-to-digital converter (ADC) configured to convert the power level signal into a digital value; and a digital jammer detection unit configured to generate the RF jammer indication signal based on the digital value.

27. The apparatus of any of clauses 18-26, wherein the receiver bias circuit comprises:

a set of supply voltage rails to receive a set of supply voltages, respectively;

a set of switching devices configured to provide a selected one of the set of supply voltages to the receiver in response to a control signal, wherein the selected one of the set of supply voltages is the first supply voltage; and a control circuit configured to generate the control signal based on the RF jammer indication signal.

28. The apparatus of clause 27, further comprising another set of one or more switching devices coupled in series with a set of one or more resistors between one or more of the set of supply voltage rails and the receiver, respectively.

29. A method, comprising:

processing a radio frequency (RF) signal received at an input to generate a baseband signal;

generating a signal indicative of whether an RF jammer is present at the input; and generating a supply voltage based on the RF jammer indication signal, wherein processing the RF signal to generate the baseband signal is based on the supply voltage.

30. The method of clause 29, wherein generating the supply voltage comprises:

generating the supply voltage at a first voltage level in response to the RF jammer indication signal indicating that the RF jammer is present at the input; and generating the supply voltage at a second voltage level in response to the RF jammer indication signal indicating that the RF jammer is not present at the input, wherein the first voltage level is higher than the second voltage level.

31. The method of clause 29 or 30, wherein generating the supply voltage comprises generating the supply voltage at a transition voltage level between the first and second voltage levels.

32. The method of any of clauses 29-31, further comprising maintaining a gain, associated with processing the RF signal to generate the baseband signal, substantially constant and independent of the supply voltage.

33. The method of any of clauses 29-32, wherein processing the RF signal to generate the baseband signal comprises:

amplifying the RF signal to generate an amplified RF signal;

mixing the amplified RF signal with a local oscillator (LO) signal to generate a mixed signal; and filtering the mixed signal to generate the baseband signal, wherein at least one of the amplifying, mixing, or filtering is based on the supply voltage.

34. The method of any of clauses 29-33, wherein generating the supply voltage based on the RF jammer indication signal comprises changing the supply voltage during a cyclic prefix (CP) time interval between two downlink (DL) time intervals.

35. The method of any of clauses 29-34, further comprising not generating the supply voltage based on the RF jammer indication signal in response to a power level of a target RF received signal at or above a threshold.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
a receiver;
a radio frequency (RF) jammer detector including an input coupled to the receiver; and
a receiver bias circuit including an input coupled to an output of the RF jammer detector, and a supply voltage output, configured to produce an adjustable supply voltage, coupled to a supply voltage input of the receiver, wherein the receiver bias circuit comprises:
a set of supply voltage rails to receive different supply voltages, respectively;
a set of switching devices coupled between the set of supply voltage rails and the supply voltage output, respectively;
an additional switching device coupled in series with a resistor between one of the set of supply voltage rails and the supply voltage output; and
a control circuit, wherein an input of the control circuit is the input of the receiver bias circuit, and an output of the control circuit is coupled to the set of switching devices, respectively.

2. The apparatus of claim 1, wherein the receiver comprises a low noise amplifier (LNA), and wherein the input of the RF jammer detector is coupled to an input of the LNA.

3. The apparatus of claim 1, wherein the receiver comprises a low noise amplifier (LNA), and wherein the input of the RF jammer detector is coupled to an output of the LNA.

4. The apparatus of claim 1, wherein the RF jammer detector comprises:
a power detector, wherein an input of the power detector is the input of the RF jammer detector; and
a comparator including a first input coupled to an output of the power detector, and a second input to receive a reference voltage, wherein an output of the comparator is the output of the RF jammer detector.

5. The apparatus of claim 1, wherein the RF jammer detector comprises:
a power detector, wherein an input of the power detector is the input of the RF jammer detector;
an analog-to-digital converter (ADC) including an input coupled to an output of the power detector; and
a digital jammer detection unit including an input coupled to an output of the ADC, wherein an output of the digital jammer detection unit is the output of the RF jammer detector.

6. The apparatus of claim 1, wherein the receiver comprises a low noise amplifier (LNA), and wherein the supply voltage input of the receiver comprises a supply voltage input of the LNA.

7. The apparatus of claim 1, wherein the receiver comprises a baseband filter configured to filter a mixed signal generated by a mixer to generate a baseband signal, and wherein the supply voltage input of the receiver comprises a supply voltage input of the baseband filter.

8. The apparatus of claim 1, wherein the receiver comprises a mixer configured to mix a received radio frequency (RF) signal with a local oscillator (LO) signal generated by a local oscillator to generate a mixed signal, and wherein the supply voltage input of the receiver comprises a supply voltage input of the mixer.

9. The apparatus of claim 1, wherein the receiver comprises an analog-to-digital converter (ADC) configured to convert a baseband signal generated by a baseband filter into a digital baseband signal, and wherein the supply voltage input of the receiver comprises a supply voltage input of the ADC.

10. The apparatus of claim 1, wherein the control circuit includes another input to receive a signal indicative of a power level of a target received signal at an input of the receiver.

11. The apparatus of claim 1, wherein the control circuit includes another input to receive a receiver enable signal.

12. The apparatus of claim 1, further comprising a modem including an input coupled to an output of the receiver.

13. The apparatus of claim 12, wherein the input of the RF jammer detector is configured to receive and process an RF signal.

14. The apparatus of claim 1, further comprising a set of one or more other receiver bias circuits including a set of one or more other supply voltage outputs coupled to one or more other supply voltage inputs of the receiver, respectively.

15. The apparatus of claim 1, wherein the RF jammer detector includes a power detector configured to rectify an RF signal from the receiver to generate a signal indicative of a power level at an input of the receiver.

16. An apparatus, comprising:
a receiver configured to process a radio frequency (RF) signal to generate a baseband signal;
a radio frequency (RF) jammer detector configured to process the RF signal to generate a signal indicative of whether an RF jammer is present at an input of the receiver; and
a receiver bias circuit configured to generate a first supply voltage for the receiver based on the RF jammer indication signal, wherein the receiver bias circuit comprises:
a set of supply voltage rails to receive a set of supply voltages, respectively;
a set of switching devices configured to provide a selected one of the set of supply voltages to the receiver in response to a control signal, wherein the selected one of the set of supply voltages is the first supply voltage;
another set of one or more switching devices coupled in series with a set of one or more resistors between one or more of the set of supply voltage rails and the receiver, respectively; and
a control circuit configured to generate the control signal based on the RF jammer indication signal.

17. The apparatus of claim 16, wherein the receiver bias circuit is configured to:
generate the first supply voltage at a first voltage level in response to the RF jammer indication signal indicating that the RF jammer is present at the input of the receiver; and
generate the first supply voltage at a second voltage level in response to the RF jammer indication signal indicating that the RF jammer is not present at the input of the receiver, wherein the first voltage level is higher than the second voltage level.

18. The apparatus of claim 16, further comprising a receiver constant gain bias circuit configured to maintain a gain of the receiver substantially constant and independent of the first supply voltage.

19. The apparatus of claim 16, wherein the receiver bias circuit is configured to change the first supply voltage during a cyclic prefix (CP) time interval between two downlink (DL) time intervals.

20. The apparatus of claim 16, wherein the receiver bias circuit is configured to disable the generating of the first supply voltage based on the RF jammer indication signal in response to a power level of a target received signal being at or above a threshold.

21. The apparatus of claim 16, wherein the RF jammer detector comprises:
- a power detector configured to generate a signal indicative of a power level of the RF signal at the input of the receiver; and
- a comparator configured to generate the RF jammer indication signal based on a comparison of the power level signal to a threshold.

22. The apparatus of claim 16, wherein the RF jammer detector comprises:
- a power detector configured to generate a signal indicative of a power level of the RF signal at the input of the receiver;
- an analog-to-digital converter (ADC) configured to convert the power level signal into a digital value; and
- a digital jammer detection unit configured to generate the RF jammer indication signal based on the digital value.

* * * * *